United States Patent
Takayama et al.

(10) Patent No.: US 6,229,150 B1
(45) Date of Patent: May 8, 2001

(54) SEMICONDUCTOR STRUCTURES USING A GROUP III-NITRIDE QUATERNARY MATERIAL SYSTEM WITH REDUCED PHASE SEPARATION AND METHOD OF FABRICATION

(75) Inventors: Toru Takayama, Menlo Park; Takaaki Baba, Los Altos; James S. Harris, Jr., Stanford, all of CA (US)

(73) Assignee: Matsushita Electronics Corp., Osaka (JP)

( * ) Notice: Subject to any disclaimer, the term of this patent is extended or adjusted under 35 U.S.C. 154(b) by 0 days.

(21) Appl. No.: 09/365,105

(22) Filed: Jul. 30, 1999

(51) Int. Cl.[7] ............ H01L 29/06; H01L 31/0328; H01L 33/00
(52) U.S. Cl. ............ 257/12; 257/13; 257/22; 257/94; 257/96; 257/103
(58) Field of Search ............ 257/12, 13, 14, 257/22, 94, 96, 103

(56) References Cited

U.S. PATENT DOCUMENTS 5,689,123 * 11/1997 Major et al. ............ 257/22

FOREIGN PATENT DOCUMENTS

4310569 * 9/1994 (DE) ............ H01S/3/19
4310571 * 9/1994 (DE) ............ H01L/33/00

OTHER PUBLICATIONS

M. Asif Kahn et al., "Growth of High Optical and Electrical Quality GaN Layers Using Low–Pressure Metalorganic Chemical Vapor Deposition", Appl. Phys. Lett, 58 (5), Feb. 4, 1991, pp. 526–527.

S. Nakamura, "InGaN/GaN/AlGaN–Based Laser Diodes With an Estimated Lifetime of Longer Than 10,000 Hours", MRS Bulletin, vol. 23, No. 5, pp. 37–43, May 1998.

* cited by examiner

Primary Examiner—Minh Loan Tran
(74) Attorney, Agent, or Firm—James E. Eakin; McDermott, Will & Emery

(57) ABSTRACT

A group III-nitride quatenary material system and method is disclosed for use in semiconductor structures, including laser diodes, transistors, and photodetectors, which reduces or eliminates phase separation and provides increased emission efficiency and reliability. In an exemplary embodiment the semiconductor structure includes first GaAlNAs layer of a first conduction type formed substantially without phase separation, an GaAlNAs active layer substantially without phase separation, and a third GaAlNAs layer of an opposite conduction type formed substantially without phase separation.

15 Claims, 9 Drawing Sheets

SEMICONDUCTOR STRUCTURES USING A GROUP III-NITRIDE QUATERNARY MATERIAL SYSTEM WITH REDUCED PHASE SEPARATION AND METHOD OF FABRICATION

RELATED APPLICATIONS

This application relates to U.S. patent application Ser. No. 09/277,319 filed Mar. 26, 1999 in the names of the same inventors and assigned to the same assignee.

FIELD OF THE INVENTION

This application relates to semiconductor structures and processes, and particularly relates to group III-nitride materials systems and methods such as might be used in blue or ultraviolet laser diodes and other similar semiconductors.

BACKGROUND OF THE INVENTION

The development of the blue laser light source has heralded the next generation of high density optical devices, including disc memories, DVDS, and so on. FIG. 1 shows a cross sectional illustration of a prior art semiconductor laser devices. (S. Nakamura, MRS BULLETIN, Vol. 23, No. 5, pp. 37–43, 1998.) On a sapphire substrate 5, a gallium nitride (GaN) buffer layer 10 is formed, followed by an n-type GaN layer 15, and a 0.1 $\mu$m thick silicon dioxide ($SiO_2$) layer 20 which is patterned to form 4 $\mu$m wide stripe windows 25 with a periodicity of 12 $\mu$m in the GaN<1–100>direction. Thereafter, an n-type GaN layer 30, an n-type indium gallium nitride ($In_{0.1}Ga_{0.9}N$) layer 35, an n-type aluminum gallium nitride ($Al_{0.14}Ga_{0.86}$ N)/GaN MD-SLS (Modulation Doped Strained-Layer Superlattices) cladding layer 40, and an n-type GaN cladding layer 45 are formed. Next, an $In_{0.02}Ga_{0.98}N/In_{0.15}Ga_{0.85}N$ MQW (Multiple Quantum Well) active layer 50 is formed followed by a p-type $Al_{0.2}Ga_{0.8}N$ cladding layer 55, a p-type GaN cladding layer 60, a p-type $Al_{0.14}Ga_{0.86}N$/GaN MD-SLS cladding layer 65, and a p-type GaN cladding layer 70. A ridge stripe structure is formed in the p-type $Al_{0.14}Ga_{0.86}N$/GaN MD-SLS cladding layer 65 to confine the optical field which propagates in the ridge waveguide structure in the lateral direction. Electrodes are formed on the p-type GaN cladding layer 70 and n-type GaN cladding layer 30 to provide current injection.

In the structure shown in FIG. 1, the n-type GaN cladding layer 45 and the p-type GaN 60 cladding layer are light-guiding layers. The n-type $Al_{0.14}Ga_{0.86}N$/GaN MD-SLS cladding layer 40 and the p-type $Al_{0.14}Ga_{0.86}N$/GaN MD-SLS cladding layer 65 act as cladding layers for confinement of the carriers and the light emitted from the active region of the InGaN MQW layer 50. The n-type $In_{0.1}Ga_{0.9}N$ layer 35 serves as a buffer layer for the thick AlGaN film growth to prevent cracking.

By using the structure shown in FIG. 1, carriers are injected into the InGaN MQW active layer 50 through the electrodes, leading to emission of light in the wavelength region of 400 nm. The optical field is confined in the active layer in the lateral direction due to the ridge waveguide structure formed in the p-type $Al_{0.14}Ga_{0.86}N$/GaN MD-SLS cladding layer 65 because the effective refractive index under the ridge stripe region is larger than that outside the ridge stripe region. On the other hand, the optical field is confined in the active layer in the transverse direction by the n-type GaN cladding layer 45, the n-type $Al_{0.14}Ga_{0.86}N$/GaN MD-SLS cladding layers 40, the p-type GaN cladding layer 60, and the p-type $Al_{0.14}Ga_{0.86}N$/GaN MD-SLS cladding layer 65 because the refractive index of the of the active layer is larger than that of the n-type GaN cladding layer 45 and the p-type GaN cladding layer 60, the n-type $Al_{0.14}Ga_{0.86}N$/GaN MD-SLS layer 40, and the p-type GaN cladding layer 60. Therefore, fundamental transverse mode operation is obtained.

However, for the structure shown in FIG. 1, it is difficult to reduce the defect density to the order of less than $10^8$ $cm^{-2}$, because the lattice constants of AlGaN, InGaN, and GaN are sufficiently different from each other that defects are generated in the structure as a way to release the strain energy whenever the total thickness of the n-type $In_{0.1}Ga_{0.9}N$ layer 35, the $In_{0.02}Ga_{0.98}N/In_{0.15}Ga_{0.85}N$ MQW active layer 50, the n-type $Al_{0.14}Ga_{0.86}N$/GaN MD-SLS cladding layer 40, the p-type $Al_{0.14}Ga_{0.86}N$/GaN MD-SLS cladding layer 65, and the p-type $Al_{0.2}Ga_{0.8}N$ cladding layer 55 exceeds the critical thickness. The defects result from phase separation and act as absorption centers for the lasing light, causing decreased light emission efficiency and increased threshold current. The result is that the operating current becomes large, which in turn causes reliability to suffer.

Moreover, the ternary alloy system of InGaN is used as an active layer in the structure shown in FIG. 1. In this case, the band gap energy changes from 1.9 eV for InN to 3.5 eV for GaN. Therefore, ultraviolet light which has an energy level higher than 3.5 eV cannot be obtained by using an InGaN active layer. This presents difficulties, since ultraviolet light is attractive as a light source for the optical pick up device in, for example, higher density optical disc memory systems and other devices.

To better understand the defects which result from phase separation in conventional ternary materials systems, the mismatch of lattice constants between InN, GaN, and AlN must be understood. The lattice mismatch between InN and GaN, between InN and AlN, and between GaN and AlN, are 11.3%, 13.9%, and 2.3%, respectively. Therefore, an internal strain energy accumulates in an InGaAlN layer, even if the equivalent lattice constant is the same as that of the substrate due to the fact that equivalent bond lengths are different from each other between InN, GaN, and AlN. In order to reduce the internal strain energy, there is a compositional range which phase separates in the InGaAlN lattice mismatched material system, where In atoms, Ga atoms, and Al atoms are inhomogeneously distributed in the layer. The result of phase separation is that In atoms, Ga atoms, and Al atoms in the InGaAlN layers are not distributed uniformly according to the atomic mole fraction in each constituent layer. In turn, this means the band gap energy distribution of any layer which includes phase separation also becomes inhomogeneous. The band gap region of the phase separated portion acts disproportionately as an optical absorption center or causes optical scattering for the waveguided light. As noted above, a typical prior art solution to these problems has been to increase drive current, thus reducing the life of the semiconductor device.

As a result, there has been a long felt need for a semiconductor structure which minimizes lattice defects due to phase separation and can be used, for example, as a laser diode which emits blue or UV light at high efficiency, and for other semiconductor structures such as transistors.

SUMMARY OF THE INVENTION

The present invention substantially overcomes the limitations of the prior art by providing a semiconductor structure which substantially reduces defect densities by materially reducing phase separation between the layers of the structure. This in turn permits substantially improved emission efficiency.

To reduce phase separation, it has been found possible to provide a semiconductor device with GaAlNAs layers having homogeneous Al content distribution as well as homogeneous As content distribution in each layer. In a light emitting device, this permits optical absorption loss and waveguide scattering loss to be reduced, resulting in a high efficiency light emitting device. By carefully selecting the amounts of Al and As, devices with at least two general ranges of band gaps may be produced, allowing development of light emitting devices in both the infrared and the blue/uv ranges.

In a first exemplary embodiment of a GaAlNAs quaternary material system in accordance with the present invention, sufficient homogeneity to avoid phase separation has been found when the Al content, represented by x, and the As content, represented by y, ideally satisfy the condition that $3.18(1-x)(1-y)+3.99(1-x)y+3.11x(1-y)+4xy$ nearly equals to a constant value. In a typical embodiment of a light emitting device, the constant value may be 3.18. The lack of phase separation results because the lattice constants of the constituent layers in the structure are sufficiently close to each, in most cases being nearly equal, that the generation of defects is suppressed.

A device according to the present invention typically includes a first layer of GaAlNAs material of a first conductivity, an GaAlNAs active layer, and a layer of GaAlNAs material of an opposite conductivity successively formed on one another. By maintaining the mole fractions essentially in accordance with the formula $3.18(1-x)(1-y)+3.99(1-x)y+3.11x(1-y)+4xy$ nearly equals to a constant value, for example on the order of or nearly equal to 3.18, the lattice constants of the constituent layers remain substantially equal to each other, leading to decreased generation of defects.

In an alternative embodiment, the semiconductor structure is fabricated essentially as above, using a quaternary materials system to eliminate phase separation and promote homogeneity across the layer boundaries. Thus, as before, the first cladding layer is a first conduction type and composition of GaAlNAs, the active layer is GaAlNAs of a second composition, and the second cladding layer is an opposite conduction type of GaAlNAs having the composition of the first layer. However, in addition, the second cladding layer has a ridge structure. As before, the optical absorption loss and waveguide scattering loss is reduced, leading to higher efficiencies, with added benefit that the optical field is able to be confined in the lateral direction in the active layer under the ridge structure. This structure also permits fundamental transverse mode operation.

In a third embodiment of the invention, suited particularly to implementation as a laser diode, the semiconductor structure comprises a first cladding of a first conduction type of an $Ga_{1-x1}Al_{x1}N_{1-y1}As_{y1}$ material, an active layer of an $Ga_{1-x2}Al_{x2}N_{1-y2}As_{y2}$ material, and a second cladding layer of an opposite conduction type of an $Ga_{1-x3}Al_{x3}N_{1-y3}As_{y3}$ material, each successively formed on the prior layer. In such a materials system, x1, x2, and x3 define the Al content and y1, y2, and y3 define the As content. Moreover, x1, y1, x2, y2, x3, and y3 have a relationship of $0<x1<1$, $0<x2<1$, $0<x3<1$, $0<y1<1$, $0<y2<1$, $0<y3<1$, $0.26x1+37y1<=1$, $0.26x2+37y2<=1$, $0.26x3+37y3<=1$, $Eg_{GaN}(1-x1)(1-y1)+Eg_{GaAs}(1-x1)y1+Eg_{AlN}x1(1-y1)+Eg_{AlAs}x1y1>Eg_{GaN}(1-x2)(1-y2)+Eg_{GaAs}(1-x2)y2+Eg_{AlN}x2(1-y2)+Eg_{AlAs}x2y2$, and $Eg_{GaN}(1-x3)(1-y3)+Eg_{GaAs}(1-x3)y3+Eg_{AlN}x3(1-y3)+Eg_{AlAs}x3y3>Eg_{GaN}(1-x2)(1-y2)+Eg_{GaAs}(1-x^2)y2+Eg_{AlN}x2(1-y2)+Eg_{AlAs}x2y2$, where $Eg_{GaN}$, $Eg_{GaAs}$, $Eg_{AlN}$, and $Eg_{AlAs}$ are the band gap energy of GaN, GaAs, AlN, and AlAs, respectively.

To provide a reproducible semiconductor structure according to the above materials system, an exemplary embodiment of GaAlNAs layers have Al content, x, and As content, y, which satisfy the relationship $0<x<1$, $0<y<1$ and $0.26x+37y<=1$. As before, this materials system permits reduction of the optical absorption loss and the waveguide scattering loss, resulting in a high efficiency light emitting device. Moreover, the band gap energy of the GaAlNAs of an active layer becomes smaller than that of the first cladding layer and the second cladding layer when x1, y1, x2, y2, x3, and y3 have a relationship of $0<x1<1$, $0<x2<1$, $0<x3<1$, $0<y1<1$, $0<y2<1$, $0<y3<1$, $0.26x1+37y1<=1$, $0.26x2+37y2<=1$, $0.26x3+37y3<=1$, $Eg_{GaN}(1-x1)(1-y1)+Eg_{GaAs}(1-x1)y1+Eg_{AlN}x1(1-y1)+Eg_{AlAs}x1y1>Eg_{GaN}(1-x2)(1-y2)+Eg_{GaAs}(1-x2)y2+Eg_{AlN}x2(1-y2)+Eg_{AlAs}x2y2$, and $Eg_{GaN}(1-x3)(1-y3)+Eg_{GaAs}(1-x3)y3+Eg_{AlN}x3(1-y3)+Eg_{AlAs}x3y3>Eg_{GaN}(1-x2)(1-y2)+Eg_{GaAs}(1-x2)y2+Eg_{AlN}x2(1-y2)+Eg_{AlAs}x2y2$. Under these conditions, the injected carriers are confined in the active layer. In at least some embodiments, it is preferable that the third light emitting device has a GaAlNAs single or multiple quantum well active layer whose Al content, xw, and As content, yw, of all the constituent layers satisfy the relationship of $0<xw<1$, $0<yw<1$, and $0.26xw+37yw<=1$.

One of the benefits of the foregoing structure is to reduce the threshold current density of a laser diode. This can be achieved by use of a single or multiple quantum well structure, which reduces the density of the states of the active layer. This causes the carrier density necessary for population inversion to become smaller, leading to a reduced or low threshold current density laser diode.

It is preferred that in the third light emitting device, the condition of $3.18(1-xs)(1-ys)+3.99(1-xs)ys+3.11xs(1-ys)+4xsys$ nearly equals to a constant value—on the order of or near 3.18—is satisfied, wherein xs and ys are the Al content and the As content, respectively, in each the constituent layers. As before, this causes the lattice constants of the each constituent layers to be nearly equal to each other, which in turn substantially minimizes defects due to phase separation.

In a fourth embodiment of the present invention, the semiconductor structure may comprise a first cladding layer of a first conduction type of a material $Ga_{1-x1}Al_{x1}N_{1-y1}As_{y1}$, an $Ga_{1-x2}Al_{x2}N_{1-y2}As_{y2}$ active layer, and a second cladding layer of an opposite conduction type of a material $Ga_{1-x3}Al_{x3}N_{1-y3}As_{y3}$, each successively formed one upon the prior layer. In addition, the second cladding layer has a ridge structure. For the foregoing materials system, x1, x2, and x3 define the Al content, y1, y2, and y3 define the As content, and x1, y1, x2, y2, x3, and y3 have a relationship of $0<x1<1$, $0<x2<1$, $0<x3<1$, $0<y1<1$, $0<y2<1$, $0<y3<1$, $0.26x1+37y1<=1$, $0.26x2+37y2<=1$, $0.26x3+37y3<=1$, $Eg_{GaN}(1-x1)(1-y1)+Eg_{GaAs}(1-x1)y1+Eg_{AlN}x1(1-y1)+Eg_{AlAs}x1y1>Eg_{GaN}(1-x2)(1-y2)+Eg_{GaAs}(1-x2)y2+Eg_{AlN}x2(1-y2)+Eg_{AlAs}x2y2$, and $Eg_{GaN}(1-x3)(1-y3)+Eg_{GaAs}(1-x3)y3+Eg_{AlN}x3(1-y3)+Eg_{AlAs}x3y3>Eg_{GaN}(1-x2)(1-y2)+Eg_{GaAs}(1-x2)y2+Eg_{AlN}x2(1-y2)+Eg_{AlAs}x2y2$, where $Eg_{GaN}$, $Eg_{GaAs}$, $Eg_{AlN}$, and $Eg_{AlAs}$ are the band gap energy of GaN, GaAs, AlN, and AlAs, respectively.

As with the prior embodiments, each of the GaAlNAs layers have a homogeneous Al and As content distribution, which can be obtained reproducibly when Al content, x, and As content, y, of each GaAlNAs layer satisfies the relationship $0<x<1$, $0<y<1$ and $0.26x+37y<=1$. The band gap energy of the GaAlNAs active layer becomes smaller than that of the first cladding layer and the second cladding layer when x1, y1, x2, y2, x3, and y3 have a relationship of x1, y1, x2, y2, x3, and y3 have a relationship of $0<x1<1$, $0<x2<1$, $0<x3<1$, $0<y1<1$, $0<y2<1$, $0<y3<1$, $0.26x1+37y1<=1$, $0.26x2+37y2<=1$, $0.26x3+37y3<=1$, $Eg_{GaN}(1-x1)(1-y1)+Eg_{GaAs}(1-x1)y1+Eg_{AlN}x1(1-y1)+Eg_{AlAs}x1y1>Eg_{GaN}(1-x2)(1-y2)+Eg_{GaAs}(1-x2)y2+Eg_{AlN}x2(1-y2)+Eg_{AlAs}x2y2$, and $Eg_{GaN}(1-x3)(1-y3)+Eg_{GaAs}(1-x3)y3+Eg_{AlN}x3(1-y3)+Eg_{AlAs}x3y3>Eg_{GaN}(1-x2)(1-y2)+Eg_{GaAs}(1-x2)y2+Eg_{AlN}x2(1-y2)+Eg_{AlAs}x2y2$. Similar to the prior embodiments, the injected carriers are confined in the active layer and the optical field is confined in the lateral direction in the active layer under the ridge structure, producing a fundamental transverse mode operation.

Also similar to the prior embodiments, the fourth embodiment typically includes an GaAlNAs single or multiple quantum well active layer whose Al content, xw, and As content, yw, of all the constituent layers satisfy the relationship of $0<xw<1$, $0<yw<1$, and $0.26xw+37yw<=1$. Also, the condition $3.18(1-xs)(1-ys)+3.99(1-xs)ys+3.11xs(1-ys)+4xsys$ nearly equals to a constant value, for example on the order of or near 3.18 is typically satisfied, where xs and ys are the Al content and the As content, respectively, in each constituent layer. Similar parameters apply for other substrates, such as sapphire, silicon carbide, and so on.

The foregoing results may be achieved with conventional processing temperatures and times, typically in the range of 500° C. to 1000° C. See "Growth of high optical and electrical quality GaN layers using low-pressure metalorganic chemical vapor deposition," *Appl. Phys. Lett.* 58 (5), Feb. 4, 1991 p. 526 et seq.

The present invention may be better appreciated by the following Detailed Description of the Invention, taken together with the attached Figures.

FIGURES

DETAILED DESCRIPTION OF THE INVENTION

Figure 1:
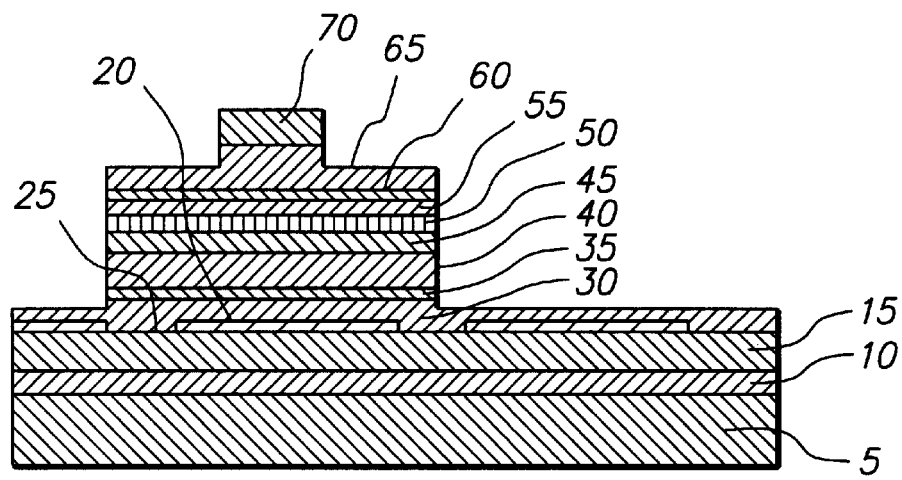
FIG. 1 shows a prior art laser diode structure using a conventional ternary materials system.
Figure 2:
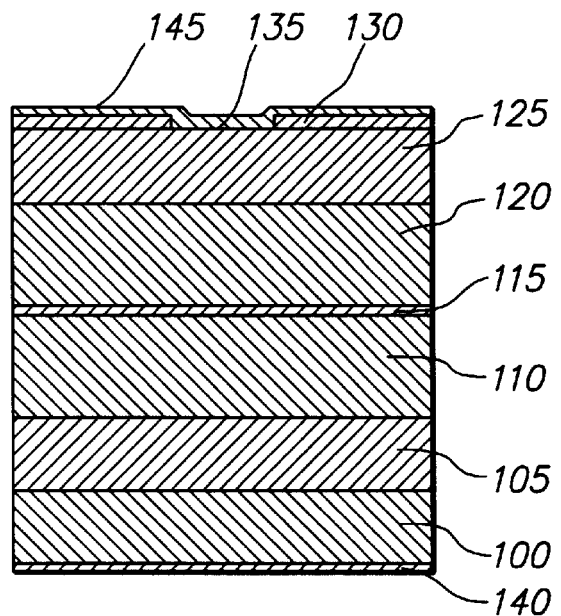
FIG. 2 shows in cross-sectional view a semiconductor structure according to a first embodiment of the invention.

Referring first to FIG. 2, shown therein in cross-sectional view is a semiconductor structure according to a first embodiment of the invention. For purposes of illustration, the semicoductor structure shown in many of the Figures will be a laser diode, although the present invention has appliction to a number of device types. With particular reference to FIG. 2, an n-type GaN substrate 100 is provided and an n-type GaN first cladding layer 105 (typically 0.5 $\mu$m thick) is formed thereon. Thereafter, a second cladding layer 110, typically of an n-type $Ga_{0.75}Al_{0.25}N_{0.979}As_{0.021}$ material which may be on the order of 1.5 $\mu$m thick, is formed thereon, followed by a multiple quantum well active layer 115 which in an exemplary arrangement may comprise three quantum well layers of $Ga_{0.95}Al_{0.05}N_{0.996}As_{0.004}$ material on the order of 35 Å thick together with four barrier layers of /$Ga_{0.85}Al_{0.15}N_{0.987}As_{0.013}$ material on the order of 35 Å thick, arranged as three pairs. Next, a third cladding layer 120 of a p-type $Ga_{0.75}Al_{0.25}N_{0.979}As_{0.021}$ (typically on the order of 1.5 $\mu$m thick) is formed, followed by a p-type GaN fourth cladding layer 125 (on the order of 0.5 $\mu$m thick). A $SiO_2$ layer 130 having one stripe like window region 135 (3.0 $\mu$m width) is formed on the p-type GaN fourth cladding layer 125. A first electrode 140 is formed on the n-type GaN substrate 100, while a second electrode 145 is formed on the $SiO_2$ layer 130 and the window region 135.

In order to emit ultra violet light with a wavelength range of 360 nm from the active layer 115, the Al content, x, and the As content, y, of all the layers generally satisfies the condition $3.18(1-x)(1-y)+3.99(1-x)y+3.11x(1-y)+4xy$ nearly equals to a constant value, which may be on the order of 3.18 for at least the first embodiment. To avoid defects due to phase separation, the lattice constants of the various constituent layers are matched to each other by setting the Al content, x, and the As content, y, in each of the layers to meet the condition $3.18(1-x)(1-y)+3.99(1-x)y+3.11x(1-y)+4xy$ nearly equals to a constant value, again, for the first embodiment on the order of 3.18±0.05 so that the equivalent lattice constants of each layers become nearly equal to the lattice constant of GaN.

By proper selection of materials, the band gap energy of the n-type second cladding layer 110 and the p-type third cladding layer 120 are larger than that of the 3 pairs of multiple quantum well active layers 115. This confines the injected carriers from the n-type second cladding layer 110 and p-type third cladding layer 120 within the active layer 115, where the carriers recombine to lead to the emission of ultraviolet light. In addition, the refractive index of the n-type second cladding layer 110 and the p-type third cladding layer 120 are smaller than that of the multiple quantum well active layer 115, which confines the optical field in the transverse direction.

Because the injected current from the electrode 145 is confined to flow through the window region 135, the region in the active layer 115 under the widow region 135 is activated strongly. This causes the local modal gain in the active layer under the window region 135 to be higher than the local modal gain in the active layer under the $SiO_2$ layer 130. Therefore, a gain guided waveguide mechanism, leading to a lasing oscillation, is able to be formed in the structure of the first embodiment.

Figure 3:
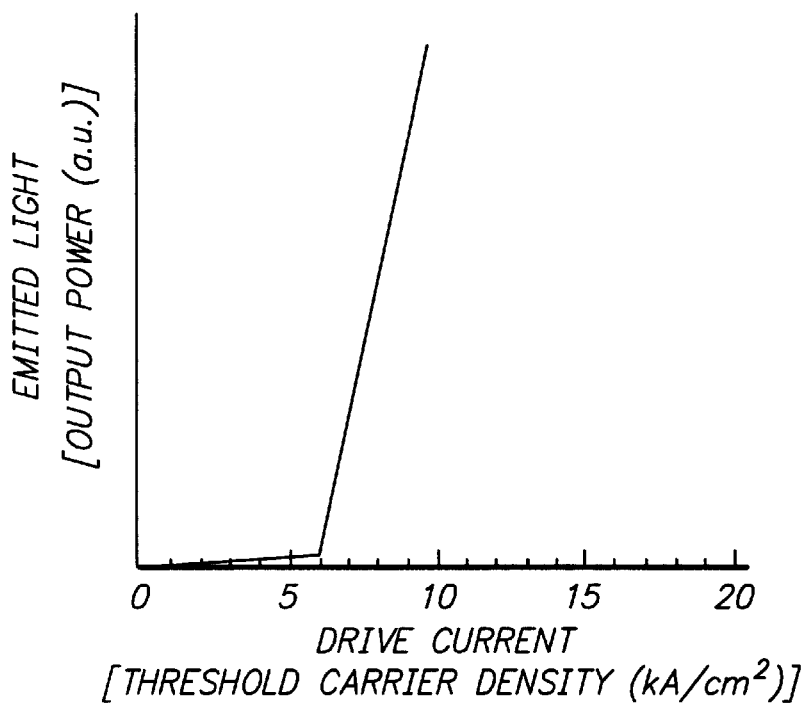
FIG. 3 shows a graph of the light-current characteristics of a laser diode according to the structure of FIG. 1.

FIG. 3 shows a plot of the emitted light versus drive current for a laser diode constructed in accordance with the first embodiment as shown in FIG. 2. The laser diode is driven with a pulsed current with a duty cycle of 1%. The threshold current density is found to be 6.0 kA/cm².

Figure 4A:
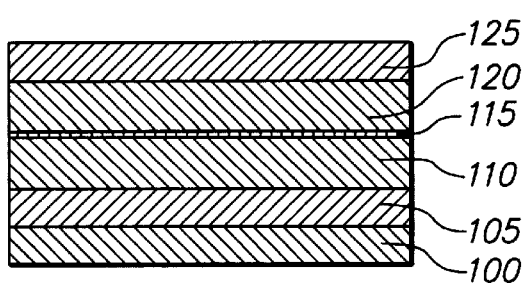
FIG. 4 shows an exemplary series of the fabrication steps for a semiconductor structure in accordance with a first embodiment of the invention.

FIGS. 4A–4D show, in sequence, a summary of the fabrication steps necessary to construct an exemplary laser diode according to the first embodiment. Since the structure which results from FIGS. 4A–4D will resemble that shown in FIG. 2, like reference numerals will be used for elements whenever possible. With reference first to FIG. 4A, an n-type GaN substrate 100 is provided, on which is grown an n-type GaN first cladding layer 105. The first cladding layer 105 is typically on the order of 0.5 $\mu$m thick. Thereafter, an n-type $Ga_{0.75}Al_{0.25}N_{0.979}As_{0.021}$ second cladding layer 110 is formed, typically on the order of 1.5 $\mu$m thick.

Next, a multiple quantum well active layer 115 is formed by creating three quantum wells comprised of three layers of $Ga_{0.95}Al_{0.05}N_{0.996}As_{0.004}$ material each on the order of 35 Å thick, together with four barrier layers of $Ga_{0.85}Al_{0.15}N_{0.987}As_{0.013}$ material on the order of 35 Å thick. A third cladding layer 120 of p-type $Ga_{0.75}Al_{0.25}N_{0.979}As_{0.021}$ material, on the order of 1.5 $\mu$m thick, is then formed, after which is formed a fourth cladding layer 125 of a p-type GaN on the order of 0.5 $\mu$m thick. Each of the layers is typically formed by either the Metal Organic Chemical Vapor Deposition (MOCVD) method or the Molecular Beam Epitaxy (MBE) method.

Figure 4B:
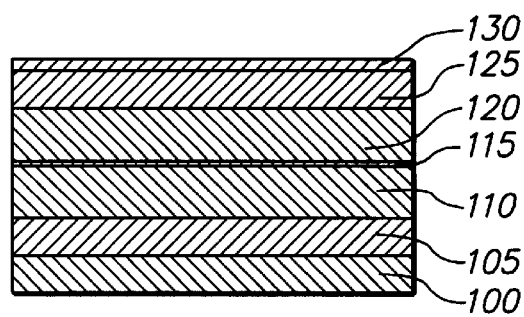
Figure 4C:
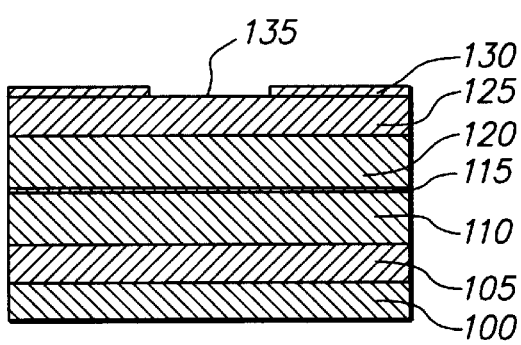
Figure 4D:
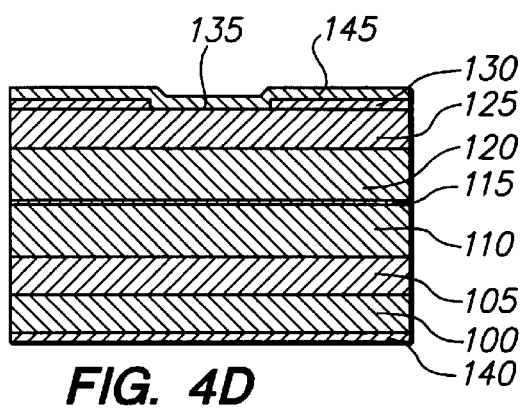

Then, as shown in FIG. 4B, a silicon dioxide ($SiO_2$) layer 130 is formed on the p-type GaN fourth cladding layer 125, for example by the Chemical Vapor Deposition (CVD) method. Using photolithography and etching or any other suitable method, a window region 135 is formed as shown in FIG. 4C. The window region 135 may be stripe-like in at least some embodiments. Finally, as shown in FIG. 4D, a first electrode 140 and a second electrode 145 are formed on the n-type GaN substrate 100 and on the $SiO_2$ layer 130, respectively, by evaporation or any other suitable process.

Figure 5:
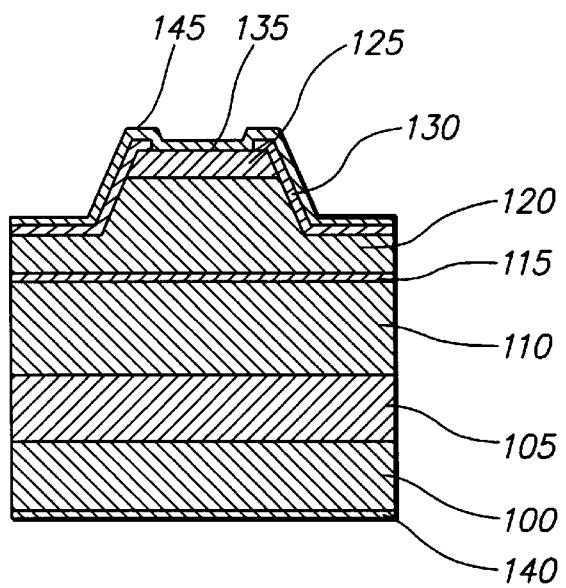
FIG. 5 shows in cross-sectional view a semiconductor structure according to a second embodiment.

Referring next to FIG. 5, a second embodiment of a semiconductor structure in accordance with the present invention may be better appreciated. As with the first embodiment, an exemplary application of the second embodiment is the creation of a laser diode. The structure of the second embodiment permits a waveguide mechanism to be built into the structure with a real refractive index guide. This provides a low threshold current laser diode which can operate with a fundamental transverse mode.

Continuing with reference to FIG. 5, for ease of reference, like elements will be indicated with like reference numerals. On an n-type GaN substrate 100, a first cladding layer 105 is formed of an n-type GaN on the order of 0.5 $\mu$m thick. Successively, an n-type second cladding layer 110 is formed of $Ga_{0.75}Al_{0.25}N_{0.979}As_{0.021}$ material on the order of 1.5 $\mu$m thick. Thereafter, a multiple quantum well active layer 115 is formed comprising three well layers of $Ga_{0.95}Al_{0.005}N_{0.996}As_{0.004}$ material on the order of 35 thick together with four barrier layers of $Ga_{0.85}Al_{0.15}N_{0.987}As_{0.013}$ material, also on the order of 35 Å thick. Next, a third, p-type cladding layer 120 formed of $Ga_{0.75}Al_{0.25}N_{0.979}As_{0.021}$ material on the order of 1.5 $\mu$m thick is formed. Thereafter, a p-type GaN fourth cladding layer 125 on the order of 0.5 $\mu$m thick is formed over the third cladding layer 120. The third and fourth cladding layers are then partially removed to create a ridge structure. A silicon dioxide ($SiO_2$) layer 130 is then formed over the fourth cladding layer 125 as well as the remaining exposed portion of the third cladding layer 120. A window region 135, which may be stripe-like on the order of 2.0 $\mu$m width, is formed through the $SiO_2$ layer above the fourth and third cladding layers 125 and 120, respectively. As with the first embodiment, a first electrode 140 is formed on the n-type GaN substrate 100 and a second electrode 145 is formed on the $SiO_2$ layer 130 and the window region 135.

As with the first embodiment, in order to emit violet light with a wavelength in the range of 350 nm from the active layer 115, the Al content, x, and the As content, y, of the well layer is set to be 0.05, 0.004, respectively. Likewise, in order to match the lattice constants of each of the constituent layers to avoid defects due to strain, the Al content, x, and the As content, y, of all the layers satisfies the condition 3.18(1−x)(1−y)+3.99(1−x)y+3.11x(1−y)+4xy nearly equals to a constant value, which may for example be 3.18±0.05. Likewise, the band gap energy of the cladding layers is maintained larger than the band gap energy for the active layer, allowing the emission of violet light. Similarly the refractive index of the materials is as discussed in connection with the first embodiment, permitting the optical field to be confined in the transverse direction.

Similar to the operation of the first embodiment, the region of the active layer 115 under the window region 135 is activated strongly because of the constraints on the injected current by the $SiO_2$ layer. The result, again, is that the local modal gain in the active layer under the window region 135 is higher than the local modal gain in the active layer under the $SiO_2$ layer 130. This, combined with the relatively higher effective refractive index in the transverse direction inside the ridge stripe region compared to that outside the ridge stripe region, provides an effective refractive index step ($\Delta n$). This results in a structure which has, built in, a waveguide mechanism of a real refractive index guide. Therefore, the design of the second embodiment provides a low threshold current laser diode which can operate with a fundamental transverse mode.

Figure 6:
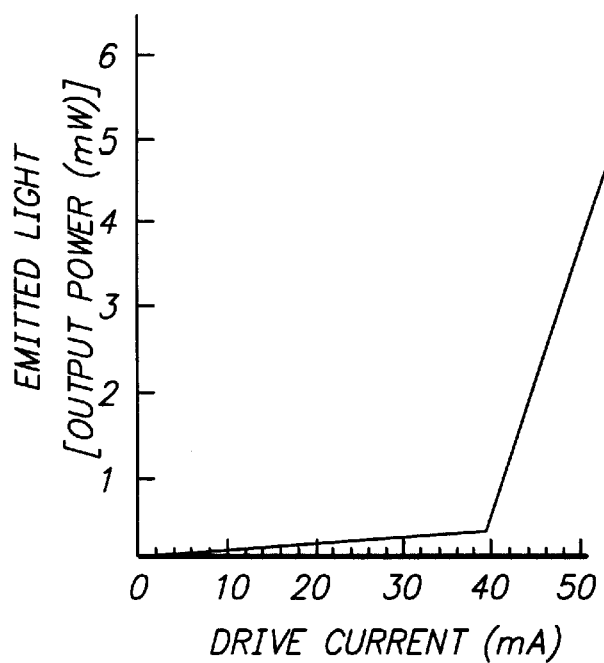
FIG. 6 shows a graph of the light-current characteristics of a laser diode according to the structure of FIG. 5.

FIG. 6 shows in graph form the emitted light versus drive current characteristics of a laser diode in accordance with the second embodiment. The laser diode is driven with a cw current. The threshold current is found to be 38.5 mA.

Referring next to FIGS. 7A–7E, a summary of the key fabrication steps is shown for an exemplary device of a semiconductor laser diode in accordance with the second embodiment.

Figure 7A:
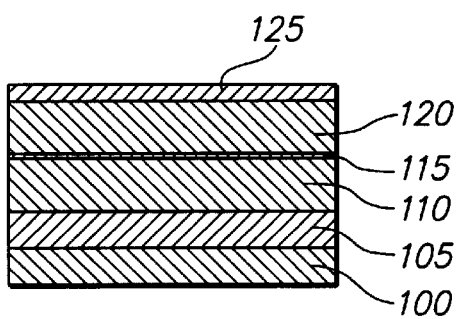
FIG. 7 shows an exemplary series of the fabrication steps for a semiconductor structure in accordance with the second embodiment of the invention.
Figure 7B:
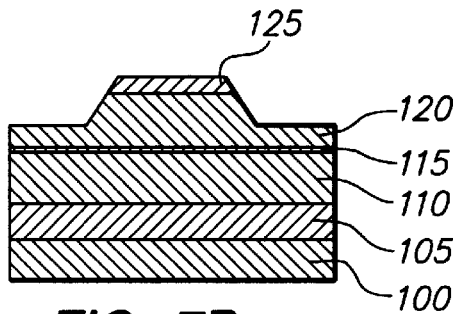

Referring first to FIGS. 7A and 7B, the formation of the first and second cladding layers 105 and 110 on an n-type GaN substrate 100, together with the three-pair multiple quantum well active layer 115 are the same as for the first embodiment. Thereafter, the third and fourth cladding layers 120 and 125 are formed and then partially removed—typically by etching—to create a ridge structure. As before, in an exemplary embodiment the various layers are formed successively by either the MOCVD or the MBE method.

Figure 7C:
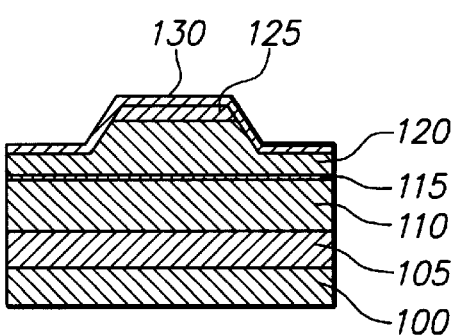
Figure 7D:
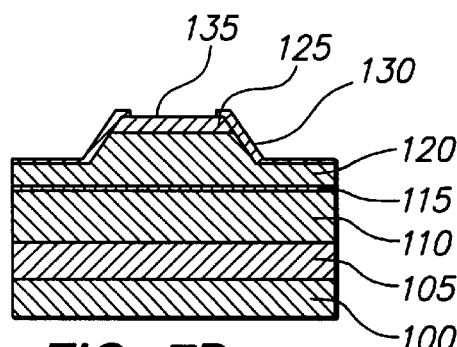
Figure 7E:
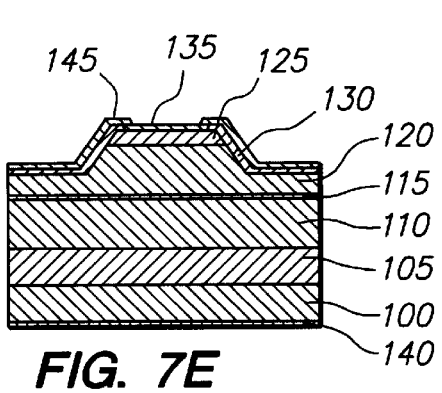

Then, as shown in FIGS. 7C–7E, a silicon dioxide layer 130 is formed over the fourth and third cladding layers 125 and 120, respectively, typically by the CVD method, after which a window region 135 is formed as with the first embodiment. Electrodes 140 and 145 are then evaporated or otherwise bonded to the structure.

Figure 8:
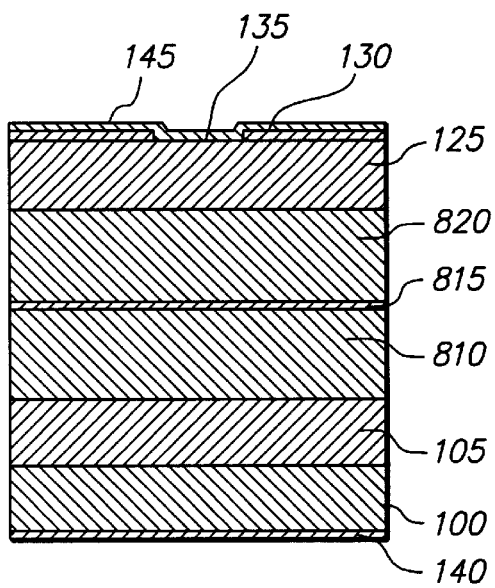
FIG. 8 is a cross-sectional illustration of a semiconductor laser diode of the third embodiment.
Figure 10A:
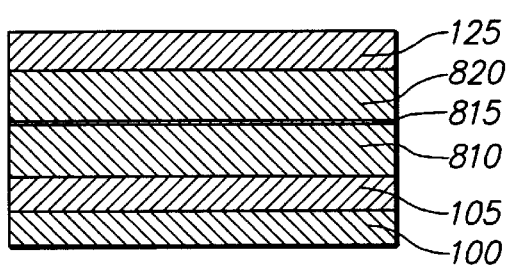
FIG. 10 shows a series of the fabrication steps of a semiconductor laser diode in one experiment example of the third embodiment.
Figure 10B:
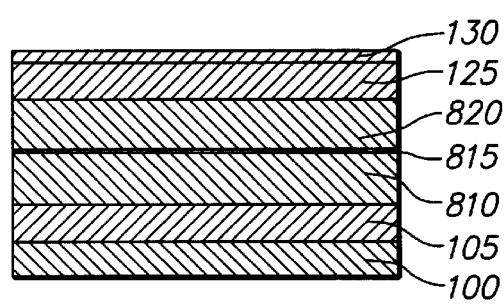
Figure 10C:
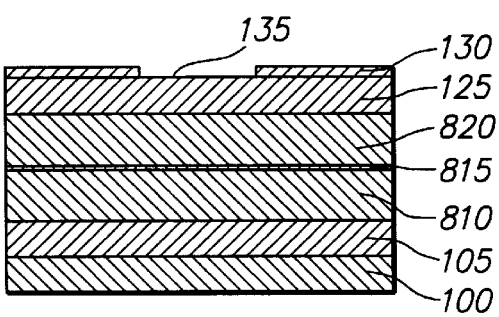
Figure 10D:
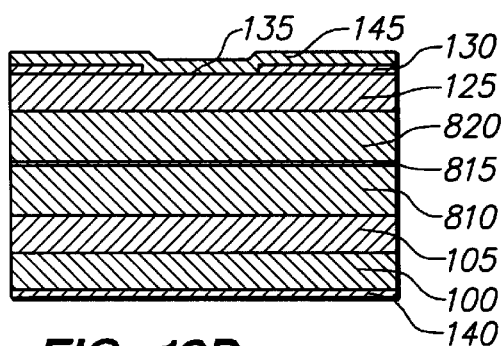

Referring next to FIG. 8, a third embodiment of the present invention may be better appreciated. The third embodiment provides slightly different mole fractions to permit the emission of ultra violet light, but is otherwise similar to the first embodiment. Thus, an n-type GaN substrate 100 continues to be used, together with an n-type GaN first cladding layer 105. However, the second cladding layer 810 is typically of n-type $Ga_{0.58}Al_{0.42}N_{0.983}As_{0.017}$ material on the order of 1.5 $\mu$m thick, while the three-pair quantum well active layer 815 typically includes three barrier layers of $Ga_{0.78}Al_{0.22}N_{0.999}As_{0.001}$ material together with four barrier layers of $Ga_{0.73}Al_{0.27}N_{0.995}As_{0.005}$ material. The third cladding layer 820 is typically a p-type $Ga_{0.58}Al_{0.42}N_{0.983}As_{0.017}$ material, while the fourth cladding layer 125 is, like the first embodiment, a p-type GaN material. The thicknesses of each layer are substantially the same as for the first embodiment. A $SiO_2$ layer 130, window region 135, and first and second electrodes 140 and 145 complete the structure.

In order to emit blue light in a wavelength range of 410 nm from the active layer 815, the Al content and the As content within the well layer 815 is set to be 0.22 and 0.001, respectively. In order to match the lattice constants of the constituent layers to avoid generation of strain-induced defects, the Al content, x, and the As content, y, of each of the layers is set to satisfy the condition $3.18(1-x)(1-y)+3.99(1-x)y+3.11x(1-y)+4xy$ nearly equals to a constant value. For exemplary purposes of the third embodiment, the constant value may be on the order of $3.17\pm0.05$.

Although the third embodiment emits blue light whereas the first embodiment emits ultraviolet light, the band gap energies of cladding layers continue to be set higher than the band gap energy of the three pairs of the multiple quantum well active layer 815. As before, that permits carrier confinement and recombination in the active layer 815. Also as with the first embodiment, the refractive index of the second and third cladding layers is, by design, smaller than that of the active layer, causing the optical field to be confined in the transverse direction. Likewise, the strong current injection under the window region 135 yields comparatively higher local modal gain in the active layer relative to the portion of the active layer under the $SiO_2$ layer 130, again resulting in a guided waveguide mechanism which leads to a lasing oscillation.

Figure 9:
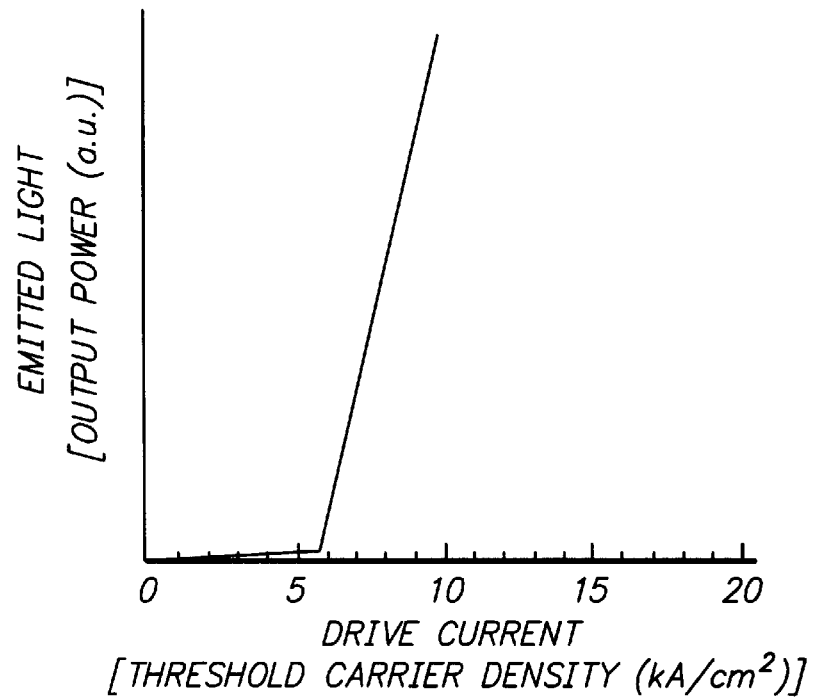
FIG. 9 shows the light-current characteristics of the laser diode of the third embodiment.

FIG. 9 shows a plot of the emitted light versus drive current characteristics of the laser diode in accordance with the third embodiment. The laser diode is driven with a pulsed current with a duty cycle of 1%. The threshold current density is found to be 5.7 $kA/cm^2$.

FIGS. 10A–10D show a series of the fabrication steps of a semiconductor laser diode in one example of the third embodiment. It will be appreciated that the fabrication steps are the same as those described in connection with FIGS. 4A–4D, and therefore are not further described.

Figure 11:
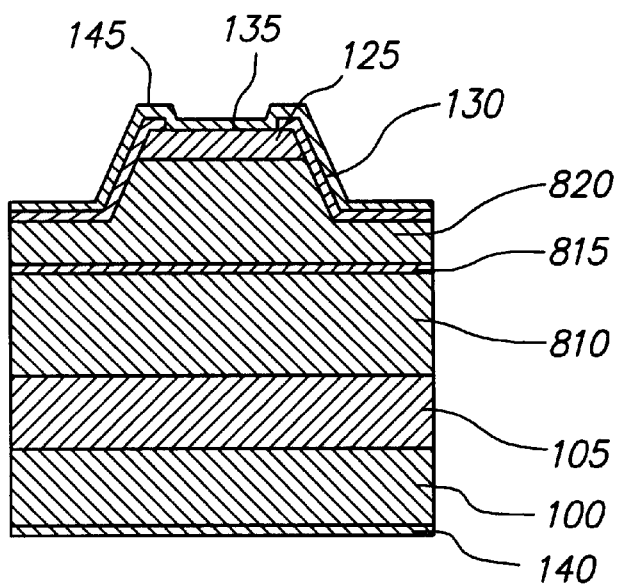
FIG. 11 is a cross-sectional illustration of a semiconductor laser diode of the fourth embodiment.

Referring next to FIG. 11, a fourth embodiment of the present invention may be better appreciated. The fourth embodiment, like the third embodiment, is designed to emit blue light and therefore has the same Al and As content as the third embodiment. However, like the second embodiment, the fourth embodiment is configured to provide a ridge structure to serve as a waveguide. Because the Al and As content is similar to that of FIG. 8, similar elements will be described with the reference numerals used in FIG. 8.

Continuing to refer to FIG. 11, the structure of the fourth embodiment can be seen to have a GaN substrate 100 on which is a formed a first cladding layer 105 followed by a second cladding layer 810. A three-pair multiple quantum well active layer 815 is formed there above, followed by a third cladding layer 820. A fourth cladding layer 125, silicon dioxide layer 130, windows 135 and electrodes 140 and 145 are all formed as before. The materials, including the Al content and As content, remain as shown for FIG. 8, or 0.22 and 0.001, respectively. Likewise the Al content, x, and the As content, y, of the layers is set to satisfy the condition $3.18(1-x)(1-y)+3.99(1-x)y+3.11x(1-y)+4xy$ nearly equals to a constant value on the order of 3.17, as with the third embodiment. The band gap energy, refractive index and modal gain for current injection are all substantially as discussed in connection with the third embodiment and are not further discussed.

Figure 12:
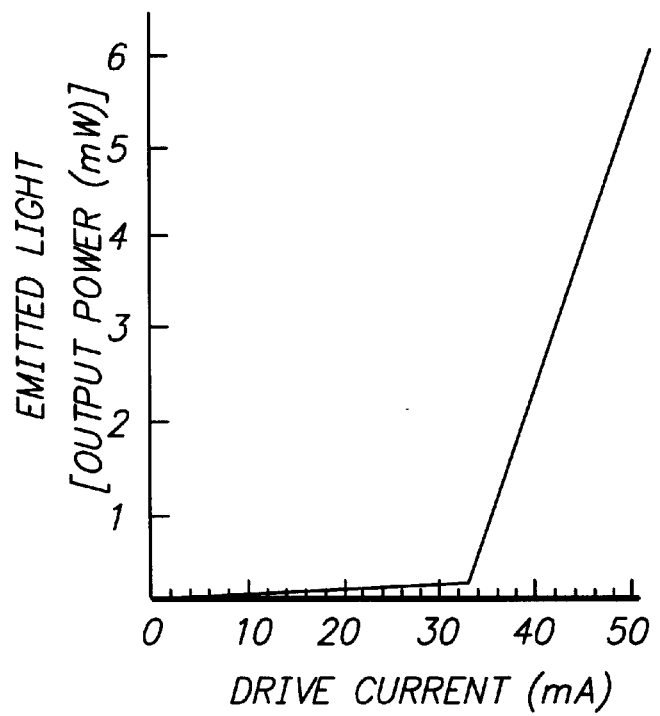
FIG. 12 shows the light-current characteristics of the laser diode of the fourth embodiment.
Figure 13A:
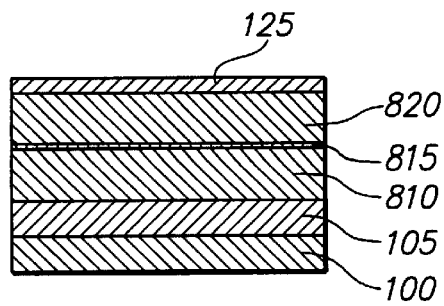
FIG. 13 shows a series of the fabrication steps of a semiconductor laser diode in one experiment example of the fourth embodiment.
Figure 13B:
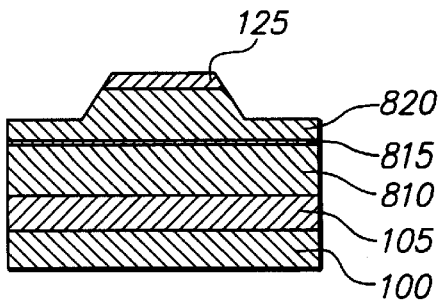
Figure 13C:
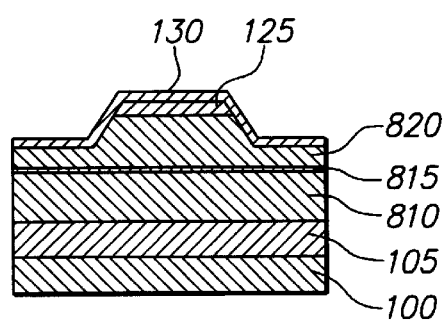
Figure 13D:
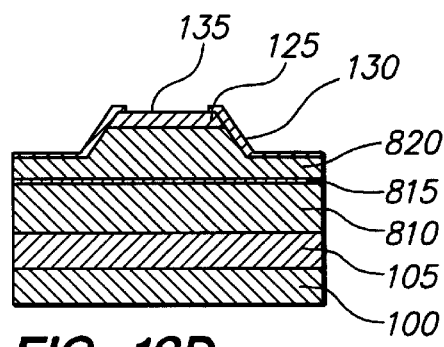
Figure 13E:
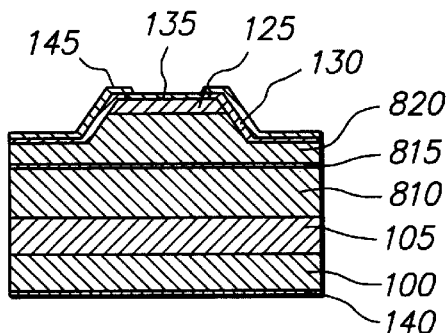

FIG. 12 plots drive current versus emitted light of a laser diode constructed in accordance with the fourth embodiment. The laser diode is driven with a cw current. The threshold current is found to be 33.0 mA.

FIG. 13 shows a summary of the fabrication steps of a semiconductor laser diode in accordance with the fourth embodiment. The steps are essentially identical to those discussed in connection with FIGS. 7A–7E and are not further discussed.

Figure 14:
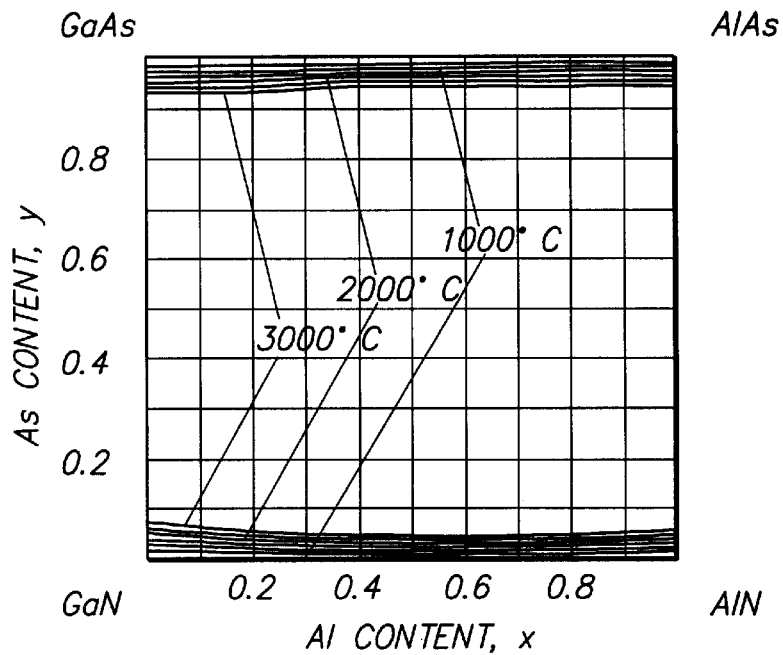
FIG. 14 shows in plot form the boundary between the phase separation region and the region without phase separation at various growth temperatures.

Referring next to FIG. 14, the selection of the Al content, x, and the As content, y, and the relationship therebetween for the constituent GaAlNAs layers may be better understood. In particular, the relative Al and As contents are required to satisfy, approximately, the relationship $0<x<1$, $0<y<1$, $0.26x+37y<=1$.

In GaAlNAs material system, the lattice constant of GaN, AlN, GaAs and AlAs are different from each other. For example, the lattice mismatch between GaN and GaAs, between AlN and AlAs, and between GaN and AlN, are 25.4%, 28.6%, and 2.3%, respectively. Therefore, an internal strain energy is accumulated in GaAlNAs layer, even if the equivalent lattice constant is the same as that of the substrate due to the fact that equivalent bond length are different from each other between GaN, AlN, GaAs and AlAs. FIG. 14 shows the boundary of phase separation region plotted against various growth temperatures. The lines in FIG. 14 show the boundary between the compositionally unstable (phase separation) region and stable region with respect to various temperatures. In those cases where phase separation occurs, Ga atoms, Al atoms, N atoms, and As atoms in the GaAlNAs layers are not distributed uniformly according to the atomic content in each constituent layer. Stated differently, the band gap energy distribution of the phase separated layer also becomes inhomogeneous in the layer. The region of the relatively small band gap region in the phase separated layer acts as an optical absorption center, or causes optical scattering for the waveguided light. This means that the phase separation phenomena should be avoided to obtain a high efficiency light emitting device.

Referring still to FIG. 14, it can be seen that the phase separation region varies with temperature. The lines in FIG. 14 show the boundary between the compositionally unstable region—that is, resulting in phase separation—and the stable region with respect to various temperatures. The region surrounded with the GaAs-GaN line, AlAs-AlN line and the boundary line shows the phase separation content region. It has been discovered that the ternary alloys AlNAs and GaNAs have a large phase separation region due to the large lattice mismatch between AlN and AlAs, and between GaN and GaAs. On the other hand, it has been found that the ternary alloys GaAlN and GaAlAs have no phase separation region at crystal growth temperatures around 1000° C., due to the small lattice mismatch between AlN and GaN, and between AlAs and GaAs.

Figure 15:
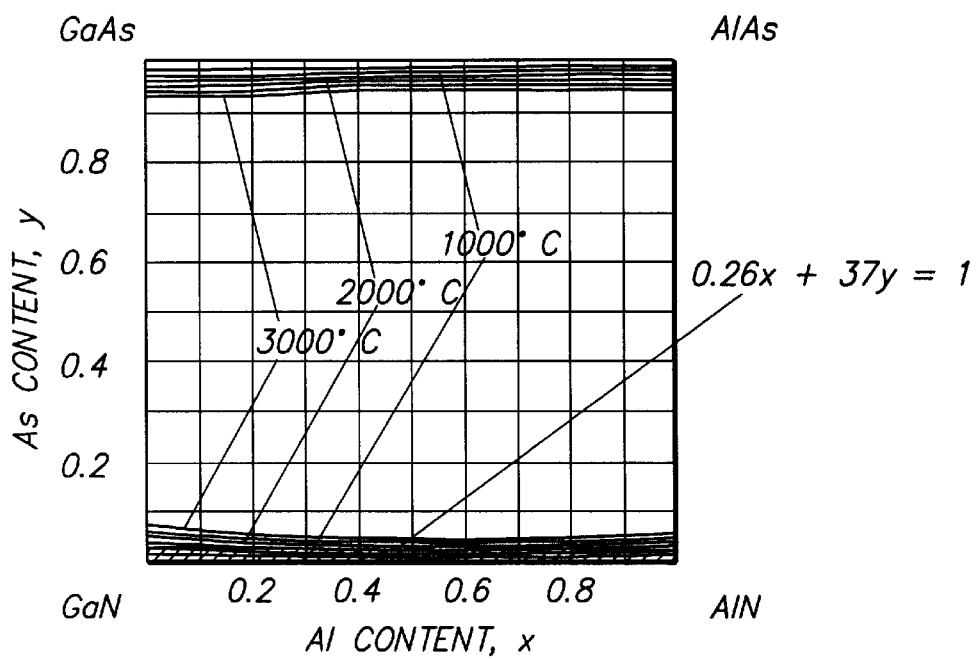
FIG. 15 shows the content choice region of Ga content and Al content in InGaAlN to avoid phase separation at a growth temperature below approximately 1000° C.

It has therefore been discovered that an GaAlNAs material system can be provided in which the usual crystal growth temperature is in the approximate range of around 600° C. to around 1000° C. Likewise, it has been discovered that phase separation of the Al content and As content of GaAlNAs does not occur in significant amounts at processing temperatures between on the order of 600° C. and on the order of 1000° C. Finally, by combining the two, the content choice region of Al content and As content in GaAlNAs to avoid phase separation at a crystal growth temperature below around 1000° C. is found to be the shadow region in FIG. 15, with the line separating the two regions being approximately defined by the relationship $0.26x+37y=1$.

Therefore, for each of the four structural embodiments disclosed hereinabove, the phase separation phenomena can be avoided in an InGaAlN material system by operating at a crystal growth temperature between on the order of 600° C. and around 1000° C., when the Ga mole fraction, x, and the AlN mole fraction, y, of the all constituent layers of the laser diodes are made to satisfy approximately the relationship of $0<x<1$, $0<y<1$, $0.26x+37y<=1$. The result is the substantially uniform distribution of Ga atoms, Al atoms, N atoms and As atoms in each constituent layer according to the atomic mole fraction.

Figure 16:
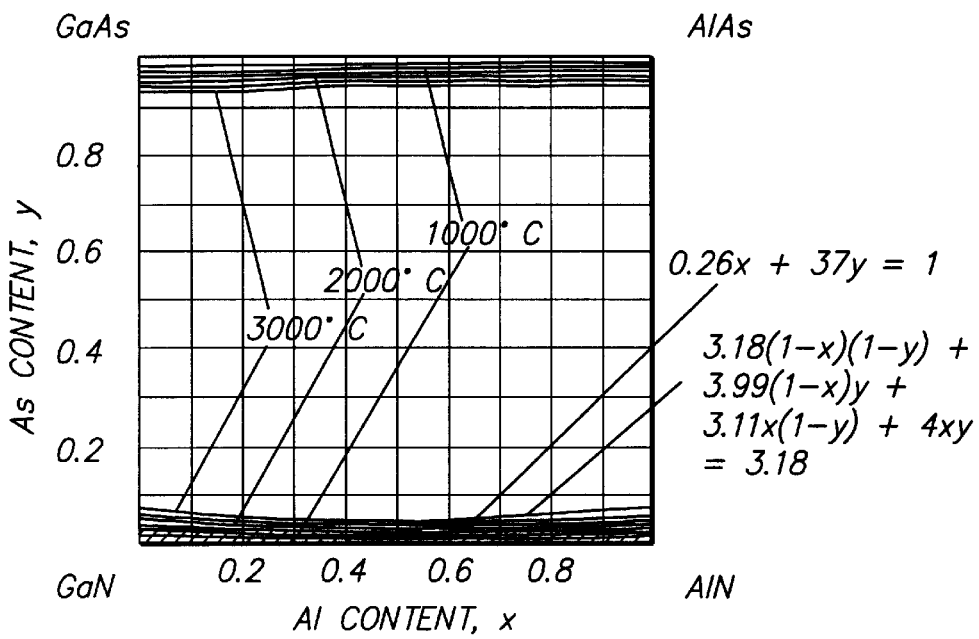
FIG. 16 shows the content choice line of Ga content and Al content in InGaAlN to avoid phase separation at a growth temperature below approximately 1000° C. which, at the same time, creates a lattice constant of InGaAlN substantially equivalent to that of GaN.

FIG. 16 shows the content choice line of Al content, x, and As content, y, in an GaAlNAs system to avoid the phase separation phenomenon at growth temperatures below around 1000° C. and still ensure a reasonable lattice match to GaN. The line in FIG. 16 shows the exemplary line of $3.18(1-x)(1-y)+3.99(1-x)y+3.11x(1-y)+4xy=3.18$. Therefore, by ensuring that the Al content and As content of the constituent GaAlNAs layers of a laser diode formed on a GaN substrate have a relationship of $3.18(1-x)(1-y)+3.99(1-x)y+3.11x(1-y)+4xy$ nearly equals to 3.18, $0<x<1$, $0<y<1$, and $0.26x+37y<=1$, a laser diode on a GaN substrate with low defect density and no or very little phase separation can be obtained.

In addition, other semiconductor structures can be fabricated with the materials system discussed above. Group-III nitride materials, especially GaN and AlN, are promising for use in electronic devices which can operate under high-power and high-temperature conditions—for example, microwave power transistors. This results, in part, from their wide band gap (3.5 eV for GaN and 6.2 eV for AlN), high breakdown electronic field, and high saturation velocity. By comparison, the band gaps of AlAs, GaAs, and Si are 2.16 eV, 1.42 eV, and 1.12 eV, respectively. This has led to significant research in the use of AlGaN/GaN materials for such field effect transistors (FETs). However, as noted previously hereinabove, the different lattice constants of AlGaN and GaN cause the generation of significant defects, limiting the mobility of electrons in the resultant structure and the utility of such materials systems for FET use.

The present invention substantially overcomes these limitations, in that the GaAlNAs/GaN material of the present invention has a lattice constant equal to GaN. As discussed hereinabove, a quaternary materials system of $Ga_{1-x}Al_xN_{1-y}As_y$, where the Al content (x) and As content (y) satisfy the relationships $0<x<1$, $0<y<1$, $0.26x+37Y<=1$, $3.18(1-x)(1-y)+3.99(1-x)y+3.11x(1-y)+4xy$ equals to 3.18, not only has a band gap greater than 3.5 eV, but also has a lattice constant substantially equal to GaN. This permits fabrication of semiconductor structures such as FETs which have substantially uniform atomic content distribution in the various layers. Therefore, by using a GaAlNAs/GaN material system in accordance with the present invention, whose Al mole fraction, x and As mole fraction, y satisfy the above relationships, high-power and high-temperature transistors with low defect density can be realized.

Figure 17A:
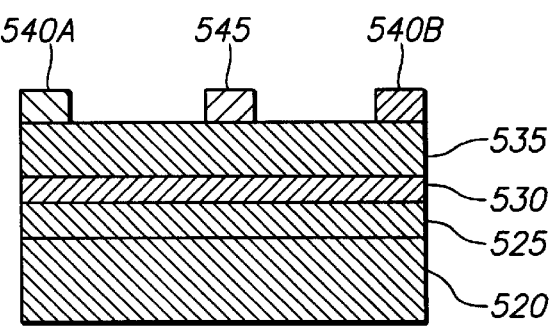
FIGS. 17A and 17B show representations of bipolar and FET transistors constructed in accordance with the materials system of the present invention.

Referring to FIG. 17A, there is shown therein an exemplary embodiment of a heterojunction field effect transistor (HFET) using GaAlNAs/GaN material in accordance with the present invention. On a GaN substrate 520, a 0.5 µm i-GaN layer 525 is formed, followed by a thin, approximately 10 nm GaN conducting channel layer 530 and a 10 nm GaAlNAs layer 535. Source and drain electrodes 540A–B, and gate electrode 545 are formed in a conventional manner. In the structure, the Al content, x, and As content, y, of the GaAlNAs layer are set to be 0.25 and 0.021, respectively. In this case, the value of x and y satisfy the relationship of $0<x<1$, $0<y<1$, $0.26x+37Y<=1$, $3.18(1-x)(1-y)+3.99(1-x)y+3.11x(1-y)+4xy=3.18$. This results in an GaAlNAs layer substantially without phase separation and with a lattice constant equal to GaN, In turn, this permits high electron velocities to be achieved because the two dimensional electron gas formed in the heterointerface of GaAlNAs and GaN layer is not scattered by any fluctuation in atomic content of the GaAlNAs layer (such as would be caused in the presence of defects). Moreover, the band gap of the GaAlNAs is larger than 4 eV so that reliable high-temperature operation can be achieved by using the structure shown in FIG. 17A.

Figure 17B:
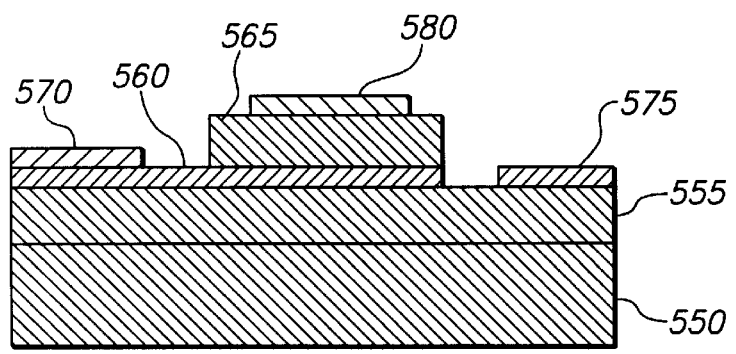

Similarly, FIG. 17B shows an embodiment of a heterojunction bipolar transistor(HBT) in accordance with the present invention. On the GaN substrate 550, a 400 nm thick n-type GaAlNAs collector layer 555 is formed, followed by a 50 nm thick p-type GaN base layer 560, and a 300 nm thick n-type GaAlNAs emitter layer 565. Base electrode 570, collector electrode 575 and emitter electrode 580 are formed conventionally. As with FIG. 17A, for the exemplary embodiment of FIG. 17B the Al and As contents x and y of the GaAlNAs layer are set to be 0.25, 0.021, respectively, and x and y are required to satisfy the same relationships as discussed above. As with FIG. 17A, an GaAlNAs layer without significant phase separation and with a lattice constant equal to GaN is realized, resulting in a very high quality heterojunction of GaAlNAs/GaN. In addition, the band gap of the GaAlNAs emitter layer (4 eV) is larger than that of the GaN base layer (3.5 eV) so that holes in the p-type base layer are well confined in that base layer. This results because of the larger valence band discontinuity between GaN and GaAlNAs than would occur in a GaN homojunction bipolar transistor. This has the benefit of obtaining a large current amplification of collector current relative to base current. Moreover, as mentioned above, the bandgap of the GaAlNAs and the GaN layer is large so that the transistor can be used reliably in high-temperature applications.

Figure 18:
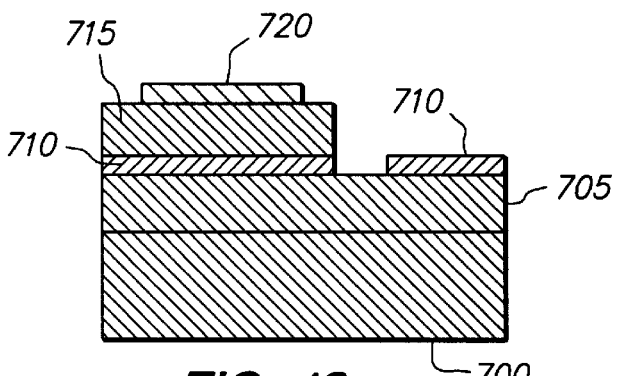
FIG. 18 shows an implementation of the presention invention as a phototransistor.

Referring next to FIG. 18, there is shown therein an implementation of the present invention as a phototransistor. In this regard, GaN and AlGaN are attractive materials for photo detectors in ultraviolet(UV) range, since both GaN and AlN have a wide band gap (3.5 eV for GaN which corresponds to the light wavelength of 350 nm, 6.2 eV for AlN which corresponds to the light wavelength of 200 nm). Due to the direct band gap and the availability of AlGaN in the entire AlN alloy composition range, AlGaN/GaN based UV photo detectors have the advantage of high quantum efficiency, as well as tunability of high cut-off wavelength. However, the lattice constant of AlGaN is sufficiently different from GaN that defects tend to be formed, which leads increased leakage current. $Ga_{1-x}Al_xN_{1-y}As_y$, where the Al content (x) and As content (y) satisfy the relationships $0<x<1$, $0<y<1$, $0.26x+37y<=1$, offers not only a band gap larger than 2.8 eV, but also can be fabricated in layers with equal atomic content distribution, so that GaAlNAs material also can be used for UV photo detector applications. Moreover, the $Ga_{1-x}Al_xN_{1-y}As_y$ quaternary material whose Al content, x and As content, y satisfy the relationship of $3.18(1-x)(1-y)+3.99(1-x)y+3.11x(1-y)+4xy=3.18$ has a lattice constant equal to GaN and a bandgap larger than 3.5 eV. Therefore, by using GaAlNAs/GaN material whose Al content, x and As content, y satisfy the above relationship, UV photo detectors with low defect density can be realized. In the event that detection of other frequencies is desired, for example blue light, only slight modification is required.

As shown in FIG. 18, the semiconductor device of the present invention can be implemented as a heterojunction phototransistor(HPT) using GaAlNAs/GaN material. On the GaN substrate 700, a GaAlNAs collector layer 705 is formed on the order of 500 nm thick n-type, followed by the formation of a 200 nm thick p-type GaN base layer 710. Thereafter, a GaAlNAs emitter layer 715 on the order of 500 nm thick is formed. On the emitter layer, a ring shaped electrode 720 is formed to permit light to impinge on the base layer.

In an exemplary structure, the Al content, x and As contnet, y of the GaAlNAs layer are set to be 0.25 and 0.021, respectively. In this case, the value of x and y satisfy the relationship of $0<x<1$, $0<y<1$, $0.26x+37Y<=1$, $3.18(1-x)(1-y)+3.99(1-x)y+3.11x(1-y)+4xy=3.18$, so that an GaAlNAs layer can be formed which substantially avoids phase separation while having a lattice constant equal to GaN, thus permitting the formation of a high quality heterojunction of GaAlNAs/GaN. The band gap of the GaAlNAs emitter layer (4 eV which corresponds to the light wavelength of 307 nm) is larger than that of GaN base layer (3.5 eV which corresponds to the light wavelength of 350 nm). The light impinges on the emitter side. For the embodiment shown, impinging light in the wavelength range between 307 nm and 350 nm is transparent to the emitter layer, so that the light in that range is absorbed in the GaN base layer and generates electron and hole pairs. The holes generated by the optical absorption in the p-type base layer are well confined in the base layer because the valence band discontinuity between GaN and GaAlNAs is larger than that for a conventional GaN homojunction photo transistor. This leads to the induction of a larger emitter current, which offers better electronic neutralization in the base region than in the case of the homojunction photo transistor. Therefore, UV photo detectors with high quantum efficiency and high sensitivity, and the resultant high conversion efficiency from input light to collector current, are obtained. In the event that other frequencies are to be detected, the GaN base layer may be replaced with, for example for blue light, InGaN.

Figure 19:
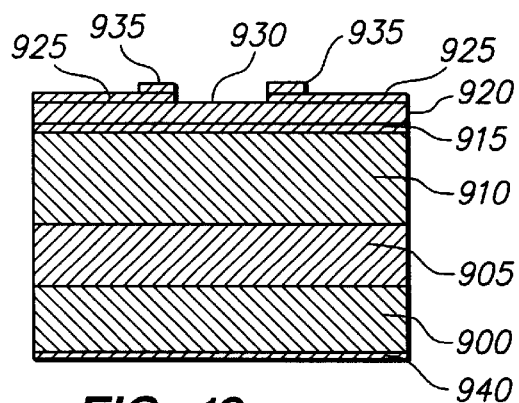
FIG. 19 shows an implementation of the present invention as a photodiode.

In addition to the phototransistor of FIG. 18, it is also possible to implement a photodiode in accordance with the present invention. Referring to FIG. 19, an n-type substrate 900 is provided, on which is formed an n-type layer 905 of $Ga_{1-x}Al_xN_{1-y}As_y$ quaternary material or equivalent, which conforms to the relationships discussed above in connection with FIG. 18. A layer 910 is formed. An active layer 915 is thereafter formed, and above that is formed a layer 920 of p-type $Ga_{1-x}Al_xN_{1-y}As_y$ quaternary material. Then, a p-type second cladding layer 925 is formed above the layer 920, and a window 930 is formed therein to expose a portion of the layer 920. The window 930 provides a port by which light can impinge on the layer 920, causing the creation of holes. A pair of electrodes 935 and 940 may be fabricated in a conventional manner, with the electrode 935 typically being a ring electrode around the window 930. It will be appreciated that the band gap of the second cladding layer 925 is preferably larger than the band gap of the layer 920, which is in turn preferably larger than the band gap of the active layer 915; such an approach provides sensitivity to the widest range of wavelength of light. If the event a narrower range is desired, a material with a lower band gap than the layer 920 may be used for the layer 925. In addition, it is also not necessary to include the layer 925 in all embodiments, as the layers 910, 915 and 920 provide, in at least some instances, an adequate photosensitive pn-junction.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

We claim:

1. A semiconductor structure comprising:

a first cladding layer of GaAlNAs material having a first conduction type, an GaAlNAs active layer, and a second cladding layer of GaAlNAs material having a conduction type opposite the first conduction type, wherein the Al content, x, and the As content y, of all the constituent layers satisfy the condition that $0.26x+37y<=1$.

2. A light emitting device according to claim 1, wherein the Al content, x, and the As content, y, of all the constituent layers satisfy the condition that $3.18(1-x)(1-y)+3.99(1-x)y+3.11x(1-y)+4xy$ nearly equals to a constant value.

3. A light emitting device according to claim 1, wherein the GaN mole fraction, x, and the AlN, y, of all the constituent layers satisfy the condition that $3.18(1-x)(1-y)+3.99(1-x)y+3.11x(1-y)+4xy$ nearly equals 3.18.

4. A semiconductor structure comprising:

a first cladding layer of GaAlNAs material having a first conduction type, an GaAlNAs active layer, and a second cladding layer of GaAlNAs material having a conduction type opposite the first conduction type, the crystal growth temperature and the mole fractions of the constituent elements of each layer being selected to minimize phase separation, wherein the Al content, x, and the As content, y, of all of the constituent layers satisfy the condition that $0.26x+37y<=1$.

5. A light emitting device comprising:
a first conduction type of an GaAlNAs first cladding layer without phase separation,
an GaAlNAs active layer without phase separation, and
a second conduction type of GaAlNAs second cladding layer without phase separation, said GaAlNAs second cladding layer having a ridge structure, all successively formed one upon each other, wherein the Al content, x, and the As content, y, of all the constituent layers satisfy the condition that $0.26x+37y<=1$.

6. A light emitting device according to claim 5, wherein the Al content, x, and the As content, y, of all the constituent layers satisfy the condition that $3.18(1-x)(1-y)+3.99(1-x)y+3.11x(1-y)+4xy$ nearly equals a constant value.

7. A light emitting device according to claim 5, wherein the Al content, x, and the As content, y, of all the constituent layers satisfy the condition that $3.18(1-x)(1-y)+3.99(1-x)y+3.11x(1-y)+4xy$ nearly equals 31.8.

8. A light emitting device comprising:
a certain conduction type of a $Ga_{1-x1}Al_{x1}N_{1-y1}As_{y1}$ first cladding layer of said certain conduction type, a $Ga_{1-x2}Al_{x2}N_{1-y2}As_{y2}$ active layer, an opposite conduction type of a $Ga_{1-x3}Al_{x3}N_{1-y3}As_{y3}$ second cladding layer, all successively formed one upon each other, wherein x1, x2, and x3 define the Al content, y1, y2, and y3 define the As content, and x1, y1, x2, y2, x3, and y3 have a relationship of $0<x1<1$, $0<x2<1$, $0<x3<1$, $0<y1<1$, $0<y2<1$, $0<y3<1$, $0.26x1+37y1<=1$, $0.26x2+37y2<=1$, $0.26x3+37y3<=1$, $Eg_{GaN}(1-x1)(1-y1)+Eg_{GaAs}(1-x1)y1+Eg_{AlN}x1(1-y1)+Eg_{AlAs}x1y1>Eg_{GaN}(1-x2)(1-y2)+Eg_{GaAs}(1-x2)y2+Eg_{AlN}x2(1-y2)+Eg_{AlAs}x2y2$, and $Eg_{GaN}(1-x3)(1-y3)+Eg_{GaAs}(1-x3)y3+Eg_{AlN}x3(1-y3)+Eg_{AlAs}x3y3>Eg_{GaN}(1-x2)(1-y2)+Eg_{GaAs}(1-x2)y2+Eg_{AlN}x2(1-y2)+Eg_{AlAs}x2y2$, where $Eg_{GaN}$, $Eg_{GaAs}$, $Eg_{AlN}$, and $Eg_{AlAs}$ are the band gap energy of GaN, GaAs, AlN, and AlAs, respectively.

9. A light emitting device according to claim 8, wherein said active layer is a GaAlNAs single or multiple quantum well active layer where Al content, xw, and As content, yw of all the constituent layers satisfy the relationship of $0<xw<1$, $0<yw<1$, and $0.26xw+37yw<=1$.

10. A light emitting device according to claim 8, wherein the condition of $3.18(1-xs)(1-ys)+3.99(1-xs)ys+3.11xs(1-ys)+4xsys$ nearly equals a constant value is satisfied, where xs and ys are the Al content and the As content, respectively in each constituent layers.

11. A light emitting device according to claim 8, wherein the relationship of $3.18(1-xs)(1-ys)+3.99(1-xs)ys+3.11xs(1-ys)+4xsys$ nearly equals 3.18 is satisfied, where xs and ys are the Al content and the As content, respectively in each constituent layers.

12. A light emitting device comprising:
a certain conduction type of a $Ga_{1-x1}Al_{x1}N_{1-y1}As_{y1}$ first cladding layer, a $Ga_{1-x2}Al_{x2}N_{1-y2}As_{y2}$ active layer, an opposite conduction type of a $Ga_{1-x3}Al_{x3}N_{1-y3}As_{y3}$ second cladding layer, said $Ga_{1-x3}Al_{x3}N_{1-y3}As_{y3}$ second cladding layer has a ridge structure, all successively formed one upon each other, wherein x1, x2, and x3 define the Al content, y1, y2, and y3 define the As content, and x1, y1, x2, y2, x3, and y3 have a relationship of $0<x1<1$, $0<x2<1$, $0<x3<1$, $0<y1<1$, $0<y2<1$, $0<y3<1$, $0.26x1+37y1<=1$, $0.26x2+37y2<=1$, $0.26x3+37y3<=1$, $Eg_{GaN}(1-x1)(1-y1)+Eg_{GaAs}(1-x1)y1+Eg_{AlN}x1(1-y1)+Eg_{AlAs}x1y1>Eg_{GaN}(1-x2)(1-y2)+Eg_{GaAs}(1-x2)y2+Eg_{AlN}x2(1-y2)+Eg_{AlAs}x2y2$, and $Eg_{GaN}(1-x3)(1-y3)+Eg_{GaAs}(1-x3)y3+Eg_{AlN}x3(1-y3)+Eg_{AlAs}x3y3>Eg_{GaN}(1-x2)(1-y2)+Eg_{GaAs}(1-x2)y2+Eg_{AlN}x2(1-y2)+Eg_{AlAs}x2y2$, where $Eg_{GaN}$, $Eg_{GaAs}$, $Eg_{AlN}$, and $Eg_{AlAs}$ are the band gap energy of GaN, GaAs, AlN, and AlAs, respectively.

13. A light emitting device according to claim 12, wherein said GaAlNAs active layer is a GaAlNAs single or multiple quantum well active layer where Al content, xw, and As content, yw of all the constituent layers satisfy the relationship of $0<xw<1$, $0<yw<1$, and $0.26xw+37yw<=1$.

14. A light emitting device according to claim 12, wherein the condition of $3.18(1-xs)(1-ys)+3.99(1-xs)ys+3.11xs(1-ys)+4xsys$ nearly equals a constant value is satisfied, where xs and ys are the Al content and the As content, respectively in each constituent layers.

15. A light emitting device according to claim 12, wherein the relationship of $3.18(1-xs)(1-ys)+3.99(1-xs)ys+3.11xs(1-ys)+4xsys$ nearly equals 3.18 is satisfied, where xs and ys are the Al content and the As content, respectively in each constituent layers.

* * * * *